(12) United States Patent
Jeon et al.

(10) Patent No.: US 9,369,121 B2
(45) Date of Patent: Jun. 14, 2016

(54) DRIVING METHOD AND DRIVING CIRCUIT FOR POWER SWITCHING DEVICE

(71) Applicant: Samsung Electronics Co., Ltd., Suwon-Si, Gyeonggi-Do (KR)

(72) Inventors: Myung-Jae Jeon, Seoul (KR); Jang-pyo Park, Hwaseong-si (KR); Jae-jung Yun, Hwaseong-si (KR); Kyu-bum Han, Hwaseong-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 14/330,652

(22) Filed: Jul. 14, 2014

(65) Prior Publication Data

US 2015/0200661 A1 Jul. 16, 2015

(30) Foreign Application Priority Data

Jan. 10, 2014 (KR) ........................ 10-2014-0003603

(51) Int. Cl.
*H03K 17/16* (2006.01)

(52) U.S. Cl.
CPC .................................. *H03K 17/161* (2013.01)

(58) Field of Classification Search
CPC ......... H03K 3/00; H03K 3/012; H03K 17/00; H03K 17/16; H03K 17/161; H03K 19/00; H03K 19/00315; H03K 19/00361; H03K 19/00384; H04L 25/00; H04L 25/0272; H04L 25/028
USPC ................................................. 327/108, 109
See application file for complete search history.

(56) References Cited

U.S. PATENT DOCUMENTS

| 7,948,220 | B2 | 5/2011 | Bahramian | |
|---|---|---|---|---|
| 8,310,283 | B2 | 11/2012 | Chen et al. | |
| 2006/0170043 | A1* | 8/2006 | Liu | H02M 1/08 257/341 |
| 2009/0002054 | A1* | 1/2009 | Tsunoda | H03K 17/0406 327/374 |
| 2011/0284862 | A1 | 11/2011 | Zhang | |
| 2012/0147640 | A1 | 6/2012 | Chang et al. | |
| 2012/0306904 | A1 | 12/2012 | Francois et al. | |

FOREIGN PATENT DOCUMENTS

KR 20101145666 B1 5/2012

OTHER PUBLICATIONS

T. Mizutani, "A Study on Current Collapse in ALGaN/GaN NEMTs Induced by Bias Stress", IEEE Transactions on Electron Devices, vol. 50, No. 10, Oct. 2003, 6pg.
R. Vetury, The Impact of Surface States on the DC and RF Characteristics of ALGaN/GaN HFETs, IEEE Transactions on Electron Devices, vol. 48, No. 3, Mar. 2001, 7pg.

(Continued)

*Primary Examiner* — John Poos
*Assistant Examiner* — David Mattison
(74) *Attorney, Agent, or Firm* — Harness, Dickey & Pierce, P.L.C.

(57) ABSTRACT

According to example embodiments, a method of driving a power switch device includes applying a first voltage to a gate electrode of the power switch device, and applying a drive voltage to the gate electrode of the power switch device after applying the first voltage to the gate electrode of the power switch device. The first voltage is higher than the drive voltage of the power switch device in a turn-on state.

22 Claims, 7 Drawing Sheets

(56) References Cited

OTHER PUBLICATIONS

"Power GaN GaN technologies for power electronic applications: Industry and market status & forecasts", Yole Development, pp. 1-13 (2014).

Fred C. Lee, "Is GaN a Game Changing Device?", The 2nd IEEE Workshop on Wide Bandgap Power Devices and Applications, pp. 1-34 (Oct. 13-15, 2014).

Yanping Ma, PhD. "EPC GaN Transistor Application Readiness: Phase One Testing", Reliability Report, EPC—Efficient Power Conversion Corporation, pp. 1-16 (2011).

Michael A. Briere, "GaN based Power Devices", RPI CFES Conference, pp. 1-37 (Jan. 25, 2013).

* cited by examiner

DRIVING METHOD AND DRIVING CIRCUIT FOR POWER SWITCHING DEVICE

RELATED APPLICATIONS

This application claims priority under 35 U.S.C. §119 to Korean Patent Application No. 10-2014-0003603, filed on Jan. 10, 2014, in the Korean Intellectual Property Office, the disclosure of which is incorporated herein in its entirety by reference.

BACKGROUND

1. Field

The present disclosure relates to a driving method and a driving circuit for a power switching device which may reduce current collapse occurring as electrons are trapped in a semiconductor layer when the power switch device is switched from an off state to an on state.

2. Description of Related Art

A high electron mobility transistor (HEMT) is one type of a power device. The HEMT may include compound semiconductors having different polarizabilities and a two-dimensional electron gas (2DEG) that is used as a carrier may be formed in a channel layer. In the HEMT, a high voltage may be applied to a drain electrode during turn-off and accordingly electrons from a gate electrode may be trapped in a channel supply layer at a drain electrode's side, or at a surface of the channel supply layer.

When the HEMT is switched from an off state to an on state, the trapped electrons fail to escape from a trap site and thus a partial area of the channel is depleted. As a result, on-resistance Rdson increases and thus current collapse may occur. The current collapse may increase resistance, increase heat, and facilitate deterioration in the HEMT. To reduce the current collapse, the trapped electrons are detrapped by applying a positive pulse voltage that is less than a threshold voltage Vth just before a turn-on period or by applying a negative pulse voltage.

SUMMARY

Example embodiments relate to a driving method of a power switch device which may reduce current collapse by decreasing on-resistance Rdson during switching of the power switch device from an off state to an on state, a driving circuit for a power switch device, and a power circuit including the driving circuit.

Additional aspects will be set forth in part in the description which follows and, in part, will be apparent from the description, or may be learned by practice of example embodiments.

According to example embodiments, a method of driving a power switch device includes applying a first voltage to a gate electrode of a power switch device. The first voltage is higher than a device voltage of the power device in a turn-on state. The method further includes applying the device voltage to the gate electrode of the power switch device after the applying the first voltage to the gate electrode of the power switch device. In example embodiments, current collapse that occurs during switching of the power switch device from a turn-off state to the turn-on state may be reduced according to application of the first voltage.

According to example embodiments, a driving circuit of a power switch device includes a first transistor, a second transistor, a third transistor, and a switching control unit. The first transistor is configured to be connected to a gate electrode of the power switch device. The second transistor is configured to be connected to the gate electrode of the power switch device. The third transistor is configured to be connected to the gate electrode of the power switch device. The switching control unit is configured to control switching of the first to third transistors in the driving circuit. The driving circuit is configured to apply a first voltage to the gate electrode the power switch device. The first voltage may be higher than a drive voltage of the power switch device in a turn-on state. The driving circuit is configured to apply the drive voltage to the gate electrode of the power switch device after applying the first voltage to the gate electrode of the power switch device.

According to example embodiments, a power circuit includes a power switch device, and a driving circuit configured to control switching of the power switch device. The driving circuit is configured to apply a first voltage to a gate electrode of the power switch device. The first voltage is higher than a drive voltage of the power switch device in a turn-on state. The driving circuit is configured to apply the drive voltage to the gate electrode of the power switch device after applying the first voltage to the gate electrode of the power switch device.

BRIEF DESCRIPTION OF THE DRAWINGS

These and/or other aspects will become apparent and more readily appreciated from the following description of non-limiting embodiments, taken in conjunction with the accompanying drawings in which:

FIGS. 1A to 3 are views for explaining a power switch device and a driving circuit therefor according to related art;

DETAILED DESCRIPTION

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Terms such as "first" and "second" are used herein merely to describe a variety of constituent elements, but the constituent elements are not limited by the terms. The terms are used only for the purpose of distinguishing one constituent element from another constituent element.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1A:
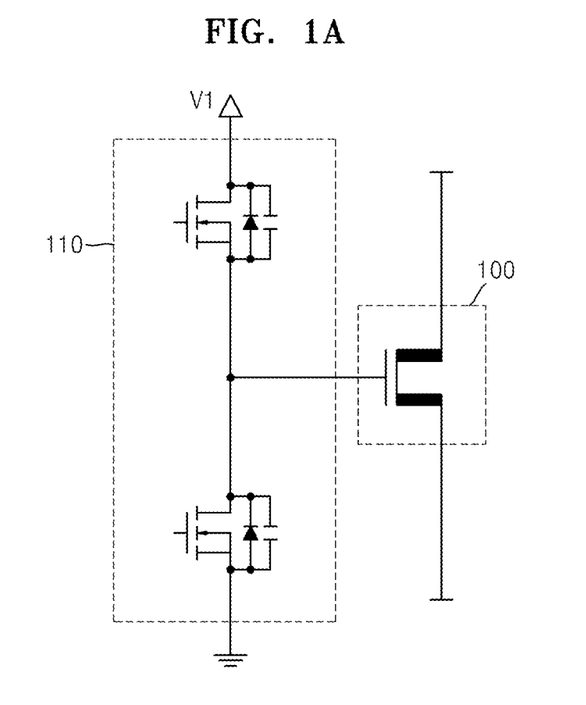

FIGS. 1A to 3 are views for explaining a power switch device 100 and a driving circuit therefor according to related art. FIG. 1A illustrates the power switch device 100 and a gate driving circuit 110. A GaN power switch device is described as an example of the power switch device 100. The GaN power switch device exhibits characteristics of a high surrender voltage and a low on-resistance due to a two-dimensional electron gas (2DEG) layer that is formed by a high band gap voltage and a heterojunction structure. Also, the GaN power switch device has a low parasitic capacitance value due to a lateral structure and thus exhibits a fast switching speed compared to silicon Si. The above two characteristics of the GaN power switch device may increase efficiency of a power conversion system or a power circuit. The power conversion system or power circuit may include applied examples such as inverters, automotives, uninterruptible power supplies (UPS's), air conditioners, refrigerators, or washing machines, but the present disclosure is not limited thereto.

Figure 1C:
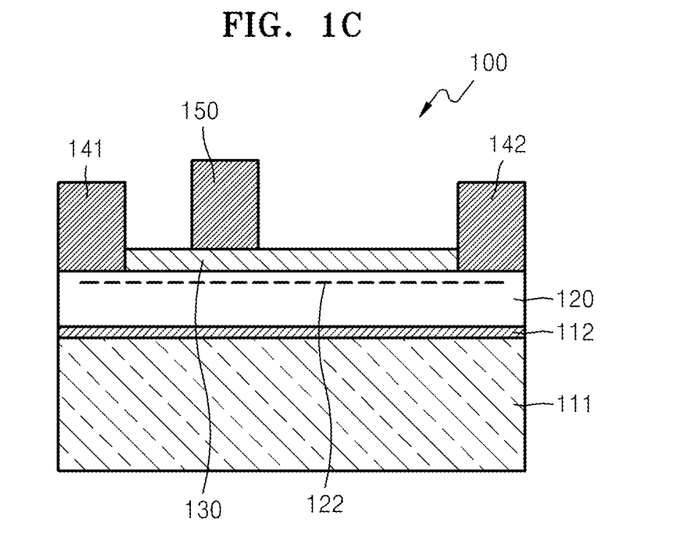

Referring to FIG. 10, in a structure of the power switch device 100, a buffer layer 112 is formed on a substrate 111. The substrate 111 may be formed of, for example, sapphire, Si, SiC, or GaN. However, the above is merely an example and the substrate 111 may be formed of a variety of materials. The buffer layer 112 may be a chemical semiconductor layer. For example, the buffer layer 112 may be a GaN layer, an AlGaN layer, or an AlGaInN layer. A seed layer (not shown) may be further provided between the substrate 111 and the buffer layer 112. The seed layer may be, for example, an AlN layer or an AlGaN layer.

A channel layer 120 including a 2DEG layer 122 exists on the buffer layer 112. The 2DEG layer 122 may be disposed under an upper surface of the channel layer 120. The 2DEG layer 122 may be used as a path for electrons.

The channel layer 120 may be formed of a first nitride semiconductor material. The first nitride semiconductor material may be a III-V group compound semiconductor material. For example, the channel layer 120 may be a GaN based material layer. As a detailed example, the channel layer 120 may be a GaN layer. In this case, the channel layer 120 may be an undoped GaN layer. However, in some cases, the channel layer 120 may be a GaN layer that is doped with desired (and/or alternatively predetermined) impurities.

A channel supply layer 130 is formed on the channel layer 120. The channel supply layer 130 may generate the 2DEG layer 122 in the channel layer 120. The 2DEG layer 122 may be formed in the channel layer 120 under a boundary surface between the channel layer 120 and the channel supply layer 130. The channel supply layer 130 may be formed of a second nitride semiconductor material that is different from the first nitride semiconductor material that forms the channel layer 120. The second nitride semiconductor material may be different form the first nitride semiconductor material in at least one of polarizability, energy bandgap, and a lattice constant. In detail, at least one of polarizability and energy bandgap of the second nitride semiconductor material may be greater than those of the first nitride semiconductor material.

The channel supply layer 130 may be formed of a nitride including at least one of, for example, Al, Ga, In, and B, and may have a monolayer or multilayer structure. As a detailed example, the channel supply layer 130 may be formed of AlGaN, AlInN, InGaN, AlN, and AlInGaN. The channel supply layer 130 may be an undoped layer or may be doped with an n-type dopant. Although silicon Si may be used as the n-type dopant, the present disclosure is not limited thereto.

The thickness of the channel supply layer 130 may be, for example, tens of nanometers (nm). For example, the thickness of the channel supply layer 130 may be less than or equal to about 50 nm, the present disclosure is not limited thereto.

A source electrode 141 and a drain electrode 142 may be formed on the channel layer 120 at opposite sides of the channel supply layer 130. The source electrode 141 and the drain electrode 142 may be formed to be in contact with the channel supply layer 130.

A gate electrode 150 is formed on the channel supply layer 130. The gate electrode 150 may be formed closer to the source electrode 141 than the drain electrode 142.

Although it is not illustrated, a protection layer (not shown) for covering the gate electrode 150 may be formed on the channel supply layer 130. The protection layer may be formed of silicon nitride or aluminum nitride.

The source electrode 141, the drain electrode 142, and the gate electrode 150 may include at least one metal and/or metal nitride, For example, the source electrode 141, drain electrode 142, and gate electrode 150 may each include at least one of Au, Ni, Pt, Ti, Al, Pd, Ir, W, Mo, Ta, Cu, TiN, TaN, and WN.

The gate driving circuit 110 or a gate driver is configured to apply a drive voltage to the gate electrode 150 of the power switch device 100 and is configured to control turning on/off of the power switch device 100. In other words, the gate driving circuit 110 forms and turns on a channel of the power switch device 100 by applying gate power to the gate electrode 150. A uniform voltage V1 is maintained for a turn-on period, that is, a period t1 in FIG. 1B. The voltage V1 is a normal drive voltage of the power switch device 100 that is, for example, a voltage higher than a threshold voltage Vt of the power switch device 10.

Figure 2:
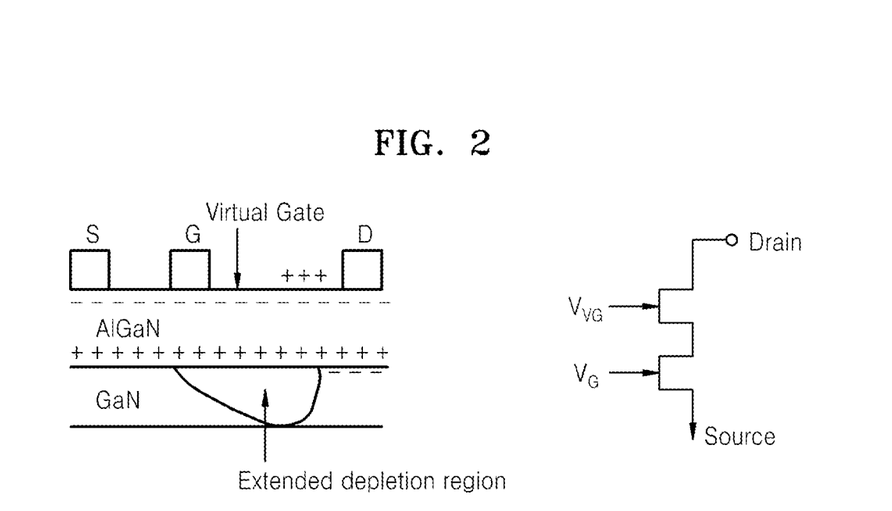

For the GaN power switch device, on-resistance occurs during driving unlike the Si device. A phenomenon in which a dynamic on-resistance or on-resistance Rdson varies is referred to as a current collapse phenomenon. In other words, when the power switch device 100 is switched from a turn-off state to a turn-on state, current decreases due to an increase in resistance in the channel of the power switch device 100. The above mechanism, that is, resistance increases/current decreases in the channel, is a result of the formation of a virtual gate composed of a surface charge. As illustrated in FIG. 2, a virtual gate electrode is formed between a gate electrode G and a drain electrode D. Since an electric potential due to a trap charge reduces (and/or prevents) formation of a channel, on-resistance increases. Thus, current decreases and efficiency of a power conversion system or a power circuit including the power switch device 100 is deteriorated.

Figure 3:
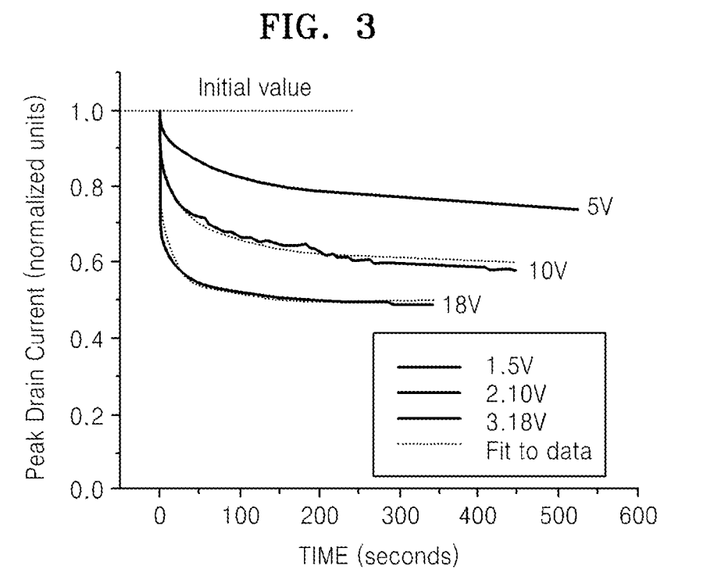

In the GaN power switch device, the current collapse phenomenon considerably increases as a voltage applied to the drain electrode D is high. As illustrated in FIG. 3, it may be seen that a decrease width of drain current gradually increases according to the application of voltages 5 V, 10 V, and 18 V to the drain electrode D. Accordingly, for a high-voltage GaN power switch device, efficiency of a system is much deteriorated due to the current collapse phenomenon.

Figure 4:
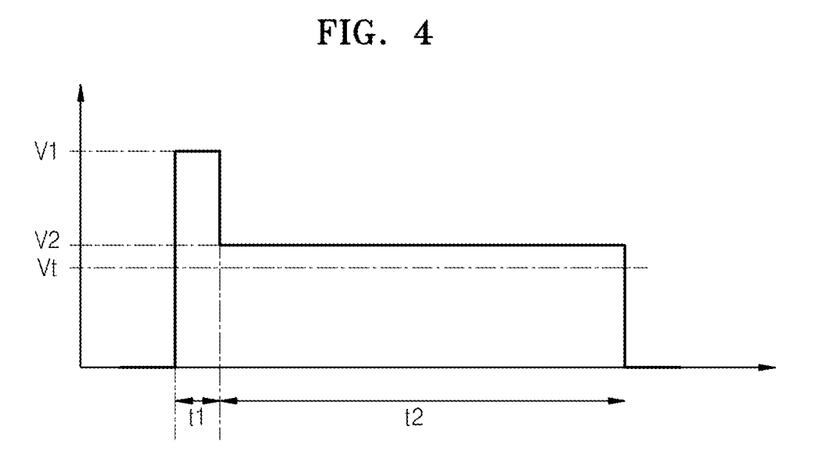
FIG. 4 is a graph for explaining a driving waveform of a power switch device according to example embodiments.

FIG. 4 is a graph for explaining a driving waveform of the power switch device 100 according to example embodiments. Referring to FIG. 4, a driving waveform is applied to the gate electrode 150 of the power switch device 100. In FIG. 4, the voltage V1 is a voltage higher than a normal drive voltage V2 and is defined to be an overdrive voltage. As illustrated in FIG. 4, the voltage V1 that is higher than the normal drive voltage V2 is applied during a period t1 during which the voltage V1 is applied, that is, in a state in which the power switch device 100 is turned on. Since a voltage higher than the threshold voltage Vt is applied to the gate electrode 150, the power switch device 100 is turned on at the time when the voltage V1 is applied. The amount of the voltage V1 may be determined according to the characteristics of the power switch device 100. The normal drive voltage V2 is applied during a period t2. The power switch device 100 maintains a turn-on state by applying the normal drive voltage V2 during the period t2 according to the applications of a power circuit. Also, the length of the period t1 during which the overdrive voltage V1 is applied is set to be shorter than the length of a normal drive period, that is, the period t2, during which the normal drive voltage V2 is applied. The length of the period t1 during which the overdrive voltage V1 is applied or a ratio between the overdrive period t1 and the normal drive period t2 may be set to differ according to the characteristics of the power switch device 100.

Figure 5:
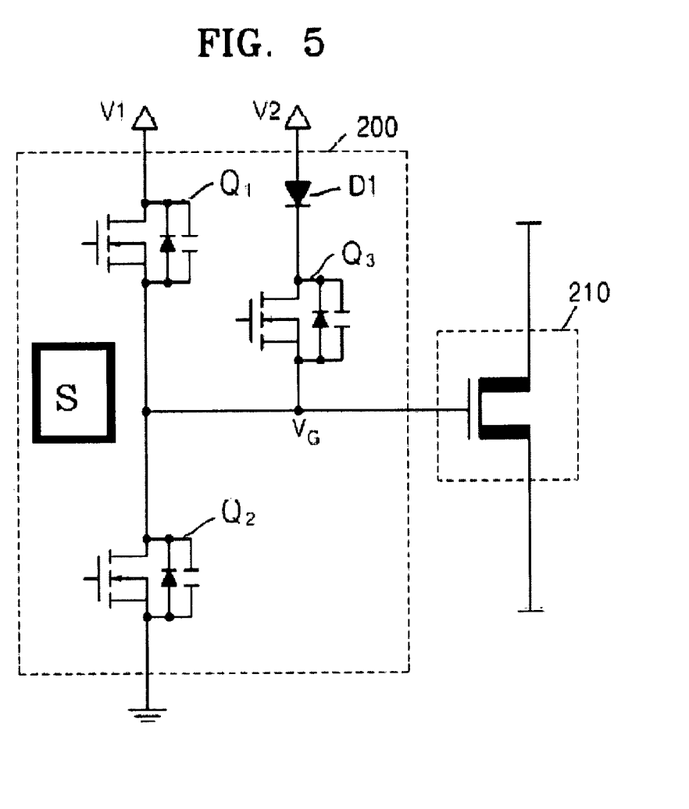
FIG. 5 is a circuit diagram of a gate driving circuit for outputting the driving waveform of FIG. 4.

FIG. 5 is a circuit diagram of a gate driving circuit 200 for outputting the driving waveform of FIG. 4. Referring to FIG. 5, a power switch device 210 and a driving circuit 200 of the power switch device 210 are illustrated.

One electrode of a first transistor Q1 is connected to a first power source (not shown) that supplies the voltage V1 and another electrode of the first transistor Q1 is connected to a gate electrode of the power switch device 210.

One electrode of a second transistor Q2 is connected to a ground electrode and another electrode of the second transistor Q2 is connected to the gate electrode of the power switch device 210.

One electrode of a third transistor Q3 is connected to a second power source (not shown) that supplies the normal drive voltage V2 and another electrode of the third transistor Q3 is connected to the gate electrode of the power switch device 210.

A blocking diode D1 is connected between the one electrode of the third transistor Q3 and the second power source.

The first to third transistors Q1 to Q3 may be an N type or a P type and the one electrode and the other electrode may be a drain electrode and a source electrode, or a source electrode and a drain electrode. Also, the first transistor Q1 and the second transistor Q2 may be configured as a half bridge type, but the present disclosure is not limited thereto.

As illustrated in FIG. 5, the driving circuit 200 further includes a switching control unit for controlling switching of the first to the third transistors Q1 to Q3 in the driving circuit by applying a drive voltage to the gate electrode of each of the first to third transistors Q1 to Q3.

Figure 6:
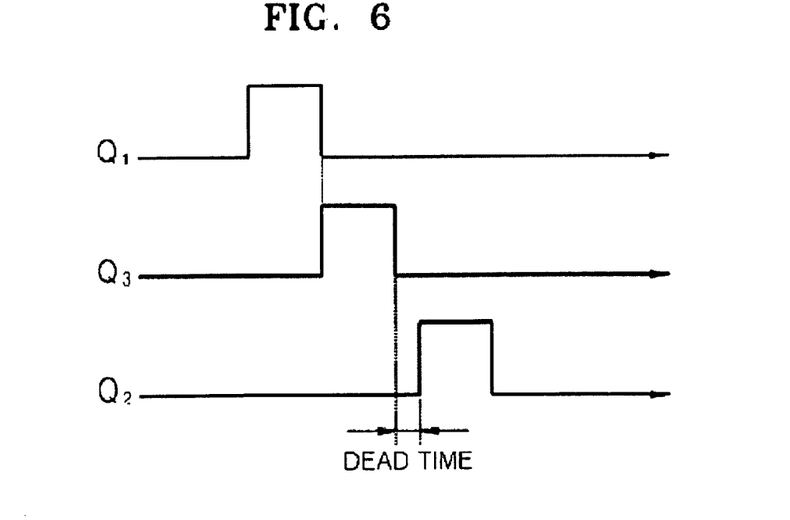
FIG. 6 is a timing diagram for switching transistors of FIG. 5.

FIG. 6 is a timing diagram for switching the first to third transistors Q1 to Q3 of FIG. 5. Referring to FIGS. 4 to 6, the switching control unit applies the first voltage V1 of the first power source by turning on the first transistor Q1 at a start point of the period t1, that is, as soon as the power switch device 210 is turned on. In doing so, the second transistor Q2 and the third transistor Q3 are in a turn-off state. As the first transistor Q1 is turned on, the first voltage V1 is applied to the gate electrode of the power switch device 210. Also, as the first voltage V1 that is higher than the drive voltage is applied during the period t1, the on-resistance Rdson of the power switch device 210 is decreased so that current collapse may be reduced. This is because a large amount of a hole current is applied to the gate electrode so as to be recombined with the trapped electrons so that electrons that interfere with a current flow are removed.

The first transistor Q1 is turned off and simultaneously the third transistor Q3 are turned on at the time point of turning from the period t1 to the period t2 in FIG. 4. In other words, no dead time is inserted between switching timings of the first transistor Q1 and the third transistor Q3. Without having to insert a dead time between switching timings of the first transistor Q1 and the third transistor Q3, a shoot through phenomenon due to the simultaneous turning-on is not generated between the first transistor Q1 and the third transistor Q3 by the blocking diode D1 of FIG. 5. According to example embodiments, overlap driving of the first transistor Q1 and the third transistor Q3, that is, simultaneously turning the first transistor Q1 off and turning the third transistor Q3 on without a dead time, may reduce and/or remove an influence of a gate leakage current of the power switch device 210 on the reduction of a gate voltage $V_G$. In FIGS. 4-6, although the first transistor Q1 and the third transistor Q3 are described to be simultaneously turned off and on, respectively, example embodiments are not limited thereto. Accordingly, the third transistor Q3 may be turned on before the first transistor Q1 is turned off, or the first transistor Q1 and the third transistor Q3 may be simultaneously turned on so as to overlap with each other.

Figure 10:
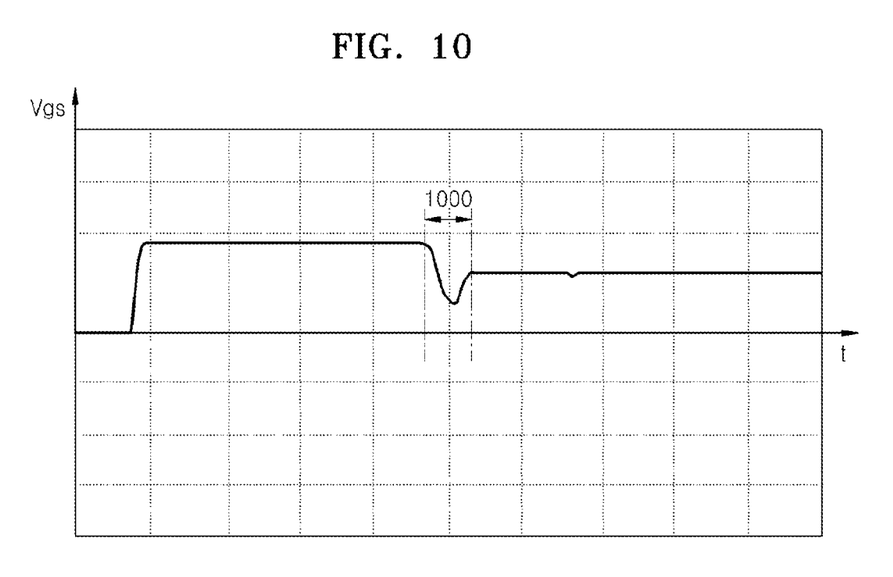
FIG. 10 is a graph for explaining an effect according to a leakage current of a gate electrode of a power switch device.

As illustrated in FIG. 10, it may be seen that a gate voltage $V_{gs}$ considerably drops in a period 1000 in which a dead time is inserted. This is because the on-resistance Rdson is increased when a phenomenon whereby the gate voltage $V_{gs}$ drops below a normal drive voltage, that is, the voltage V2, due to a gate leakage current of the GaN power switch device, occurs. Accordingly, in example embodiments, the data driving control with no dead time is performed and the shoot through phenomenon that is generated by the overlap or the simultaneous turn-on and turn-off driving is reduced (and/or prevented) by the blocking diode D1.

The gate voltage $V_G$ may be decreased due to the gate leakage current of the power switch device 210 according to the turn-off of the first transistor Q1. For example, when the voltage V1 is about 15 V and the voltage V2 is about 10 V, the third transistor Q3 is turned on. When the gate voltage $V_G$ drops from about 15 V, but not down to about 10 V, the gate voltage $V_G$ is not clamped. When the gate voltage $V_G$ drops down to about 10 V, the blocking diode D1 is turned on and the gate voltage $V_G$ is clamped to the voltage V2 via the blocking diode D1 and the third transistor Q3.

In a period after t2, when the third transistor Q3 is turned off and the second transistor Q2 is turned on, the gate voltage $V_G$ drops and the power switching device 210 is opened. In doing so, a dead time of about tens of nanoseconds (ns) is inserted between the turn-off of the third transistor Q3 and the turn-on of the second transistor Q2. Also, a dead time of about tens of nanoseconds (ns) is inserted between the turn-off of the first transistor Q1 and the turn-on of the second transistor Q2.

Figure 7:
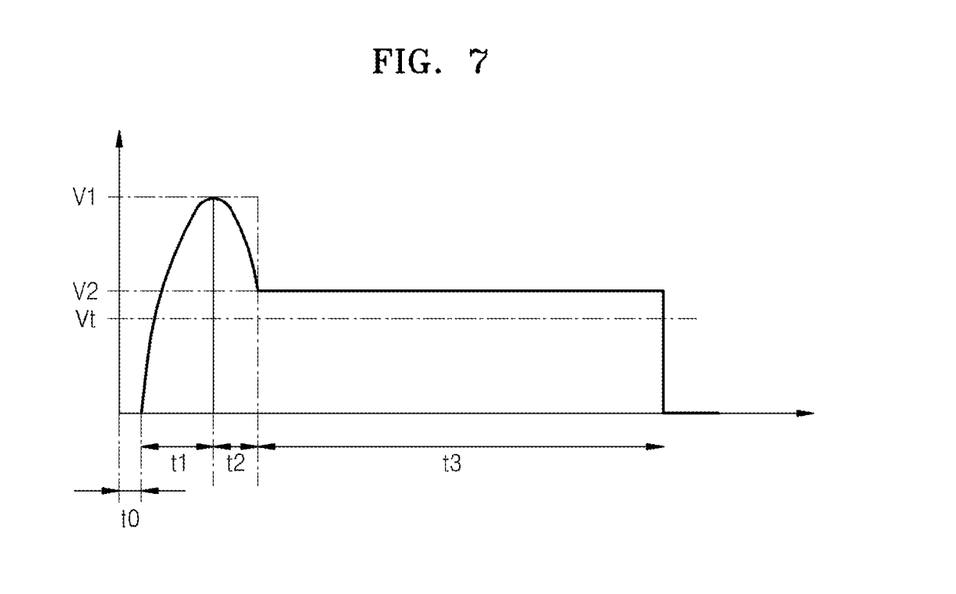
FIG. 7 is a graph for explaining a driving waveform of a power switching device according to example embodiments.

FIG. 7 is a graph for explaining a driving waveform of a power switching device according to example embodiments. Referring to FIG. 7, a driving waveform is applied to the gate electrode of the power switch device 210. A period t0 is a period before the gate voltage rises. The overdrive voltage V1 that is higher than a gate driving voltage is applied in a period t1, that is, directly after the power switch device 210 is turned on. A power source that applies the overdrive voltage V1 may be the same power source as the power source that applies the normal driving voltage V2. Accordingly, by using the same power source, a gate driving circuit may be embodied without an additional power circuit. The length of the periods t1 and t2, during which the overdrive voltage V1 is applied, is shorter than a period t3, that is, a normal period. A ratio between the length of the periods t1 and t2 and the length of each period may be set to differ according to the characteristics of the power switch device 210. The amount of the overdrive voltage V1 may be adjusted according to the applied power source, the amount of a supply voltage of a power source Vp of FIG. 8, and a time taken to accumulate current. The power source Vp may be the same power source as a second power source V2 illustrated in FIG. 8, that is, the power source that supplies the normal drive voltage V2. The overdrive voltage V1 that is accumulated in an inductor L due to the power source Vp and then applied to the power switch device 210 is adjusted to be higher than the normal drive voltage V2. As illustrated in FIG. 7, the gate driving waveform includes the period t0, the period t1 in which the voltage increases to the voltage V1, the period t2 in which the voltage decreases to the voltage V2, and the period t3 in which the voltage is maintained at the voltage V2.

Figure 8:
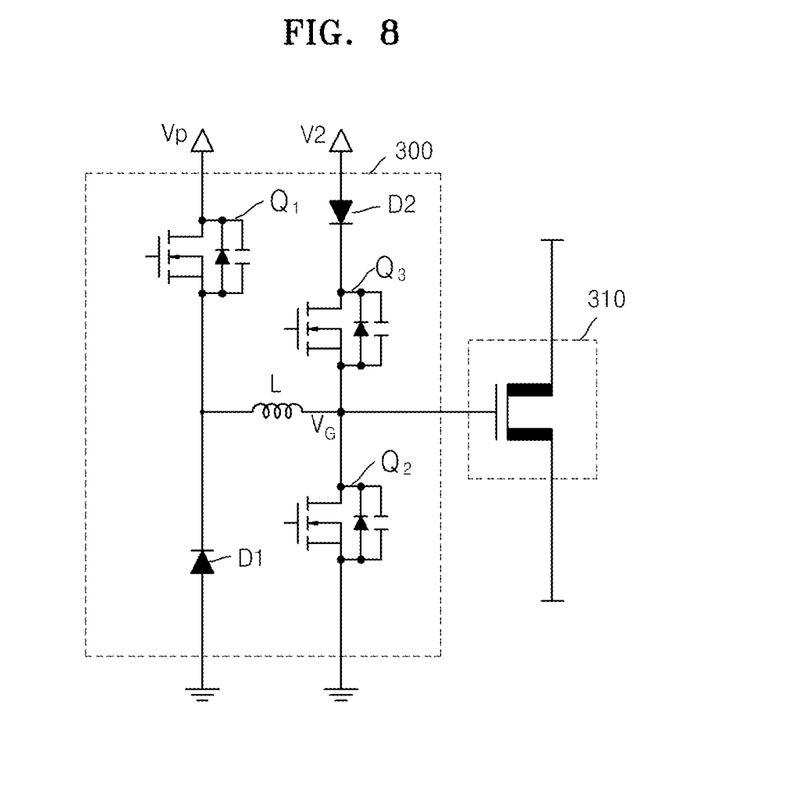
FIG. 8 is a circuit diagram of a gate driving circuit for outputting a driving waveform of FIG. 7.

FIG. 8 is a circuit diagram of a gate driving circuit for outputting a driving waveform of FIG. 7. Referring to FIG. 8, a power switch device 310 and a driving circuit 300 of the power switch device 310 are illustrated.

One electrode of the first transistor Q1 is connected to the power source Vp that supplies the overdrive voltage V1 and another electrode of the first transistor Q1 is connected to one terminal of the inductor L. The power source Vp may be the power source that supplies the voltage V2. The voltage V2 is a normal drive voltage of the power switch device 310 and is higher than the threshold voltage Vt of the power switch device 310. The inductor L accumulates energy that is supplied from the power source Vp and applies the overdrive voltage V1 of FIG. 7 that is higher than the normal drive voltage V2, to a gate electrode of the power switch device 310.

The blocking diode D1 is connected between a ground electrode and the one terminal of the inductor L.

One electrode of the second transistor Q2 is connected to another ground electrode and another electrode of the second transistor Q2 is connected to the gate electrode of the power switch device 310.

One electrode of the third transistor Q3 is connected to the second power source V2 that supplies the voltage V2 and another electrode of the third transistor Q3 is connected to the gate electrode of the power switch device 310.

A blocking diode D2 is connected between the one electrode of the third transistor Q3 and the second power source V2.

The first to third transistors Q1 to Q3 may be an N type or a P type and the one electrode and the other electrode may be a drain electrode and a source electrode, or a source electrode and a drain electrode.

Although it is not illustrated in FIG. 8, the driving circuit 300 further includes a switching control unit for controlling switching by applying a drive voltage to the gate electrode of each of the first to third transistors Q1 to Q3.

Figure 9:
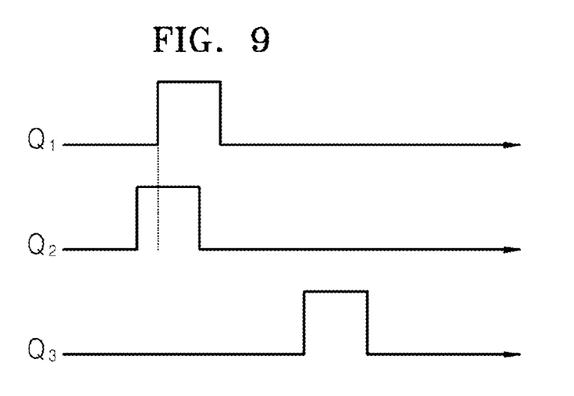
FIG. 9 is a timing diagram showing the switching of transistors of FIG. 8.

FIG. 9 is a timing diagram showing the switching of the first to third transistors Q1 to Q3 of FIG. 8. Referring to FIGS. 7 to 9, in the period to, the second transistor Q2 is turned on and current is accumulated in the inductor L by turning the first transistor Q1 on. Energy that is accumulated in the inductor L1 is determined by a turn-on time of the first transistor Q1 and an applied overdrive voltage. That is, in the period t0, a path of the first transistor Q1, the inductor L, and the second transistor Q2 is formed by turning the first transistor Q1 on and thus the current is accumulated in the inductor L.

In the period of t1, the first and second transistors Q1 and Q2 are turned off and thus the energy stored in the inductor L charges a capacitor (not shown) at the input side of the gate electrode of the power switch device 310, thereby increasing the gate voltage $V_G$. The capacitor at the input side may be a capacitor connected between the gate electrode and the source electrode of the power switch device 310. Referring to FIG. 9, although the first transistor Q1 is turned off after the second transistor Q2 is turned off, the turn-off of the first transistor Q1 and the second transistor Q2 may be simultaneously controlled. For example, the accumulated energy in the inductor L is transferred to the gate electrode by turning the second transistor Q2 off (forming a path along the first transistor Q1, the inductor L1, and the capacitor at the gate input side. Then, when the first transistor Q1 is turned off, a path is formed along the blocking diode D1, the inductor L1, and the capacitor at the gate input side. Accordingly, the gate voltage $V_G$ increases in the period t1 of FIG. 7.

In the period t2, although the third transistor Q3 is turned on, the third transistor Q3 is not electrically conductive due to the blocking diode D2. The stored energy of the inductor L is reduced by the gate leakage current and thus the gate voltage $V_G$ is decreased. The third transistor Q3 of FIG. 9 is turned on when the gate voltage $V_G$ is higher than the voltage V2. In this case, the voltage V2 is not clamped by the blocking diode D2. The gate voltage $V_G$ decreases by the gate leakage current, as illustrated in FIG. 7.

In the period t3, when the gate voltage $V_G$ drops to the voltage V2, the blocking diode D2 is turned on, forming a path along the blocking diode and the third transistor Q3, and thus the gate voltage $V_G$ is clamped to the voltage V2.

Figure 11:
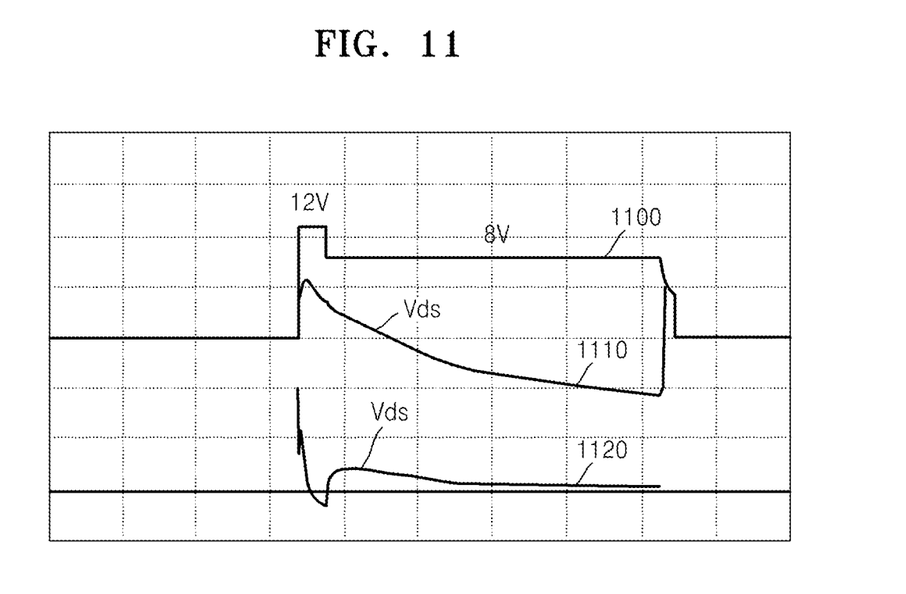
FIG. 11 is a view of a simulation of an effect of a driving method of a power switch device according to example embodiments.

FIG. 11 is an view of a simulation of an effect of a method of driving a GaN power switch device according to example embodiments.

For simulation, a resistive load is connected to a power circuit including the GaN power switch device and switching is tested. The resistive load may be a resistor of about 50 ohm. Then, a voltage Vds between the opposite ends of the GaN power switch device at an applied voltage of about 350 V is measured. According to conditions for the simulation, a constant current of about 7 A or lower flows in the GaN power switch device and the voltage Vds is proportional to the on-resistance.

A line 1110 shows a result according to the driving method of related art of FIG. 1B, in which a gate driving voltage of about 8 V is applied for 10 microseconds (μs). A line 1120 shows a result of application of the driving waveform of FIG. 4 according to example embodiments, in which the overdrive voltage V1 of about 12 V is applied for 1 microsecond and the drive voltage V2 of about 8V is applied for 9 microseconds according to the gate driving waveform 1100.

As illustrated in FIG. 11, while the line 1110 shows that the voltage Vds is relatively high in the initial period, the line 1120 shows that the voltage Vds is considerably decreased in the initial period in which the overdrive voltage is applied. Accordingly, since the on-resistance Rdson is proportional to the voltage Vds, in the driving method according to example embodiment, the on-resistance Rdson is considerably reduced and thus current collapse may be reduced.

The particular implementations shown and described herein are illustrative examples of the disclosure and are not intended to otherwise limit the scope of the disclosure in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent examples of functional relationships and/or physical or logical couplings between the various elements. It should be noted that many alternative or additional functional relationships, physical connections or logical connections may be present in a power switching device according to example embodiments.

The use of the terms "a" and "an" and "the" and similar referents in the context of describing the disclosure (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein.

Finally, the steps of all methods described herein can be performed in any suitable order unless otherwise indicated herein or otherwise clearly contradicted by context. The use of any and all examples provided herein, is intended merely to better illuminate the disclosure and does not pose a limitation on the scope of the disclosure unless otherwise claimed. Numerous modifications and adaptations will be readily apparent to those of ordinary skill in this art without departing from the spirit and scope of the claims.

As described above, according to example embodiments, by applying a voltage that is higher than a drive voltage to a gate electrode in a state in which a power switch device according to example embodiments is turned on, current collapse that occurs during switching from a turn-on state to a turn-off state of the power switch device may be reduced.

It should be understood that example embodiments described herein should be considered in a descriptive sense only and not for purposes of limitation. Descriptions of features or aspects within each power switch device according to example embodiments should typically be considered as available for other similar features or aspects in other power switch devices according to example embodiments.

While some example embodiments have been particularly shown and described, it will be understood by one of ordinary skill in the art that variations in form and detail may be made therein without departing from the spirit and scope of the claims.

What is claimed is:

1. A method of driving a power switch device, the method comprising:
    applying a first voltage to a gate electrode of a power switch device, the first voltage being higher than a drive voltage of the power switch device in a turn-on state; and
    applying the drive voltage to the gate electrode of the power switch device after applying the first voltage to the gate electrode of the power switch device, wherein
    the applying the first voltage includes turning on a first transistor connected between the gate electrode of the power switch device and a first power source configured to supply the first voltage,
    the applying the drive voltage includes turning on a third transistor without a dead time between an on state of the first transistor and an on state of the third transistor,
    the third transistor is connected between the gate electrode of the power switch device and a second power source configured to supply the second voltage,
    a second transistor is connected to the power switch device,
    a blocking diode is connected between the second power source and the third transistor, and
    the blocking diode is configured to reduce a shoot through phenomenon during a simultaneous turning off of the first transistor and turning on of the third transistor.

2. The method of claim 1, wherein a period in which the first voltage is applied to the gate electrode of the power switch device and a period in which the drive voltage is applied to the gate electrode of the power switch device are adjustable.

3. The method of claim 2, wherein the period in which the first voltage is applied to the gate electrode of the power switch device is shorter than the period in which the drive voltage is applied to the gate electrode of the power switch device.

4. The method of claim 1, wherein the applying the first voltage includes recombining negative charges trapped in a semiconductor layer of the power switch device with positive charges.

5. The method of claim 1, wherein the first transistor and the third transistor are driven to overlap with each other.

6. A method of driving a power switch device, the method comprising:
    applying a first voltage to a gate electrode of a power switch device, the first voltage being higher than a drive voltage of the power switch device in a turn-on state;

applying the drive voltage to the gate electrode of the power switch device after applying the first voltage to the gate electrode of the power switch device;
accumulating energy from a power source that supplies the first voltage,
wherein the applying the first voltage to the gate electrode of the power switch device includes transferring the accumulated energy to the gate of the power switch device, and
a gate leakage current of the power switch device reduces a gate voltage applied to the gate electrode of the power switch device during the transferring the accumulated energy of the applying the first voltage to the gate electrode.

7. The method of claim 6, wherein the applying the drive voltage includes clamping the reduced gate voltage to the drive voltage.

8. The method of claim 1, wherein the power switch device includes a group III-V nitride semiconductor.

9. The method of claim 1, wherein the power switch device is a GaN high electron mobility transistor (HEMT).

10. A driving circuit of a power switch device, the driving circuit comprising:
a first transistor configured to be connected to a gate electrode of the power switch device, the first transistor including one electrode that is connected to a first power source configured to supply a first voltage and another electrode that is connected to the gate electrode of the power switch device;
a second transistor configured to be connected to the gate electrode of the power switch device, the second transistor including one electrode that is connected to a ground electrode and another electrode that is connected to the gate electrode of the power switch device;
a third transistor configured to be connected to the gate electrode of the power switch device, the third transistor including one electrode that is connected to a second power source configured to supply a drive voltage and another electrode that is connected to the gate electrode of the power switch device; and
a switching control unit configured to control switching of the first to third transistors in the driving circuit,
the driving circuit being configured to apply the first voltage to the gate electrode of the power switch device, the first voltage being higher than the drive voltage of the power switch device in a turn-on state, and
the driving circuit being configured to apply the drive voltage to the gate electrode of the power switch device after applying the first voltage to the gate electrode of the power switch device; and
a blocking diode that is connected between the second power source and the one electrode of the third transistor, wherein
the switching control unit is configured to turn the first transistor on to apply the first voltage to the gate electrode of the power switch device, and
the switching control unit is configured to control a turn-off timing of the first transistor and a turn-on timing of the third transistor to overlap with each other.

11. The driving circuit of claim 10, wherein
a gate voltage of the power switch device decreases according to the turn-off of the first transistor, and
the gate voltage of the power switch device is clamped to the drive voltage according to the turn-on of the second transistor.

12. The driving circuit of claim 10, wherein as the turn-off timing of the first transistor and the turn-on timing of the third transistor overlap with each other, reduction of the gate voltage due to a leakage current of the power switch device is reduced.

13. A driving circuit of a power switch device, the driving circuit comprising:
a first transistor configured to be connected to a gate electrode of the power switch device;
a second transistor configured to be connected to the gate electrode of the power switch device
a third transistor configured to be connected to the gate electrode of the power switch device; and
a switching control unit configured to control switching of the first to third transistors in the driving circuit,
the driving circuit being configured to apply a first voltage to the gate electrode of the power switch device, the first voltage being higher than a drive voltage of the power switch device in a turn-on state, and
the driving circuit being configured to apply the drive voltage to the gate electrode of the power switch device after applying the first voltage to the gate electrode of the power switch device;
an inductor including one terminal that is connected to the gate electrode of the power switch device; and
a first blocking diode, wherein
the first transistor includes one electrode that is connected to a power source that is configured to supply a desired voltage,
the first transistor includes another electrode that is connected to the other terminal of the inductor,
the first blocking diode is connected between the other terminal of the inductor and a ground electrode,
the second transistor includes one electrode that is connected to the one terminal of the inductor and the ground electrode, and
the third transistor includes one electrode that is connected to the power source and another electrode that is connected to the one terminal of the inductor.

14. The driving circuit of claim 13, further comprising:
a capacitor that is connected between the gate electrode and a source electrode of the power switch device, wherein the inductor is configured to accumulate energy and charge the capacitor.

15. The driving circuit of claim 13, wherein the first voltage is adjusted according to an amount of the desired voltage and a turn-on time of the first transistor.

16. The driving circuit of claim 13, further comprising:
a second diode that is connected between the power source and the one electrode of the third transistor.

17. The driving circuit of claim 13, wherein,
as a voltage of the gate electrode decreases according to a turn-on state of the third transistor,
the voltage of the gate electrode is clamped to the drive voltage.

18. A power circuit comprising:
a power switch device; and
a driving circuit configured to control switching of the power switch device,
the driving circuit being configured to apply a first voltage to a gate electrode of the power switch device,
the first voltage being higher than a drive voltage of the power switch device in a turn-on state, and
the driving circuit being configured to apply the drive voltage to the gate electrode of the power switch device after applying the first voltage to the gate electrode of the power switch device,
wherein the power switch device is group III-V nitride semiconductor.

19. The power circuit of claim 18, wherein the power switch device is a GaN high electron mobility transistor (HEMT).

20. The power circuit of claim 18, wherein a period in which the first voltage is applied to the gate electrode of the power switch device and a period in which the drive voltage is applied to the gate electrode of the power switch device are adjustable.

21. The power circuit of claim 18, wherein, to prevent a gate leakage current of the power switch device due to the switching from the first voltage to the drive voltage, the driving circuit performs switching control on a first transistor for switching the first voltage to the drive voltage and a third transistor for switching the drive voltage without a dead time between an on state of the first transistor and an on state of the third transistor.

22. The power circuit of claim 18, wherein the driving circuit accumulates the applied first voltage, the accumulated first voltage decreases due to a gate leakage current of the power switch device, and the decreased first voltage is clamped to the drive voltage.

* * * * *